United States Patent
Howe

(10) Patent No.: US 7,019,283 B2
(45) Date of Patent: Mar. 28, 2006

(54) LED BURNING PREVENTION

(75) Inventor: Samuel H. Howe, Carson City, NV (US)

(73) Assignee: Bruce Industries, Inc., Dayton, NV (US)

(*) Notice: Subject to any disclaimer, the term of this patent is extended or adjusted under 35 U.S.C. 154(b) by 13 days.

(21) Appl. No.: 11/053,009

(22) Filed: Feb. 8, 2005

(65) Prior Publication Data

US 2005/0174781 A1    Aug. 11, 2005

Related U.S. Application Data

(60) Provisional application No. 60/543,133, filed on Feb. 9, 2004.

(51) Int. Cl.
*H01J 5/02* (2006.01)
(52) U.S. Cl. ........................... 250/239; 250/554
(58) Field of Classification Search ................ 250/239, 250/554, 216; 362/800, 11, 6
See application file for complete search history.

(56) References Cited

U.S. PATENT DOCUMENTS

| | | | |
|---|---|---|---|
| 4,529,467 A | 7/1985 | Ward et al. | |
| 5,487,946 A * | 1/1996 | McGinniss et al. | 428/413 |
| 5,785,414 A | 7/1998 | Baker et al. | |
| 6,106,140 A | 8/2000 | Krummer et al. | |
| 6,363,197 B1 | 3/2002 | Zarian et al. | |
| 2003/0114606 A1 | 6/2003 | Taniguchi et al. | |
| 2003/0166757 A1 | 9/2003 | Nishihara et al. | |
| 2004/0063815 A1 | 4/2004 | Kinose et al. | |
| 2004/0213320 A1 | 10/2004 | Bobenhausen | |

* cited by examiner

*Primary Examiner*—Que T. Le
(74) *Attorney, Agent, or Firm*—Brooks Kushman P.C.

(57) ABSTRACT

The present invention provides a flame resistant LED construction. The flame resistant LED construction of this embodiment comprises a substrate, one or more LEDs that emits light mounted on the substrate, and an intumescent material adjacent to the LEDs. The positioning of the intumescent material is such that at least a portion of the light emitted from the LEDs is unobstructed. Moreover, a sufficient amount of the intumescent material is in proximity to the LEDs that a flame on the LEDs is extinguished by the expansion of the intumescent material. The present invention also provides an LED construction in which a sufficient amount of the intumescent material is in proximity to the LEDs such that a temperature greater than or equal to about 250° F. causes the intumescent material to expand and form an insulating char which at least partially encompasses the one or more LEDs. Also provide by the invention is a method for making the LED construction of the invention.

21 Claims, 4 Drawing Sheets

LED BURNING PREVENTION

CROSS-REFERENCE TO RELATED APPLICATIONS

This application claims the benefit of U.S. Provisional Application Ser. No. 60/543,133, filed Feb. 9, 2004.

BACKGROUND OF THE INVENTION

1. Field of the Invention

In at least one aspect, the present invention relates to flame resistant light emitting diode ("LED") constructions and to methods of making such LED constructions.

2. Background Art

FAA regulations place restrictions on the flammability and flame resistance of various airline components. For example, FA Regulation 25.853 dictates airworthiness standards for transport airplanes. In particular, this regulation requires that certain components for interior compartments (interior ceiling panels, interior wall panels, partitions, gallery structure, large cabinet walls, structural flooring, and the like) occupied by crew or passengers be self-extinguishing. Moreover, these components must have a burn length not exceeding 6 inches and an average flame time after removal of the flame source not in excess of 15 seconds. Other interior compartment components as well as cargo and baggage components must also meet similar requirements.

Numerous airline components utilize light emitting diodes. Such components include LED indicators and arrays of LEDs used for illumination. LED structures used for illumination typically may have from 40 to 60 LEDs per fixture with a dimension of about 12 inches by 1.5 inches. Typically, the LEDs used in these applications include a body which includes a flammable material such as a clear epoxy. Accordingly, structures made with such LEDs may not meet FAA regulations when used in commercial airlines.

Accordingly, there exists a need for improved LED constructions with reduced flammability.

SUMMARY OF THE INVENTION

The present invention overcomes the problems of the prior art, by providing in one embodiment a flame resistant LED construction. The flame resistant LED construction of this embodiment comprises a substrate, one or more LEDs that emit light mounted on the substrate, and an intumescent material adjacent to the LEDs. The positioning of the intumescent material is such that at least a portion of the light emitted from the LEDs is unobstructed. Moreover, a sufficient amount of the intumescent material is in proximity to the LEDs that a flame on the LEDs is extinguished by the expansion of the intumescent material. The flame resistant LED construction of the present invention is advantageously used in various airplane components which must meet FAA regulation. Moreover, the flame resistant LED structures of the invention may be used in any application where reduced flammablility is desired (e.g. railway cars, automobiles, etc.)

In another embodiment of the invention, a flame resistant LED construction is provided. The flame resistant LED construction of this embodiment comprises a substrate, one or more LEDs that emit light mounted on the substrate, and an intumescent material adjacent to the LEDs. The positioning of the intumescent material is such that at least a portion of the light emitted from the LED is unobstructed. Moreover, a sufficient amount of the intumescent material is in proximity to the LEDs that when the intumescent material in proximity to the LEDs attains a temperature greater than or equal to about 250° F. the intumescent material expands and forms an insulating char which at least partially encompasses the one or more LEDs.

In yet another embodiment of the invention, a method of making the flame resistant LED construction set forth above is provided. The method of this embodiment comprises adapting one or more sheets of intumescent material to receive a predetermined pattern of one or more LEDs that are mounted on a substrate and then placing the sheets of intumescent material on the substrate onto which the one or more LED's are mounted. A sufficient amount of the intumescent material is in proximity to the LED that when the intumescent material is in proximity to the LED attains a temperature greater than or equal to about 250° F. the intumescent material expands and forms an insulating char which at least partially encompasses the one or more LEDs.

DETAILED DESCRIPTION OF THE PREFERRED EMBODIMENT(S)

Reference will now be made in detail to presently preferred compositions or embodiments and methods of the invention, which constitute the best modes of practicing the invention presently known to the inventors.

As used herein, "intumescent" means a material that expands and chars when exposed to a sufficiently high temperature or to a flame.

Figure 1:
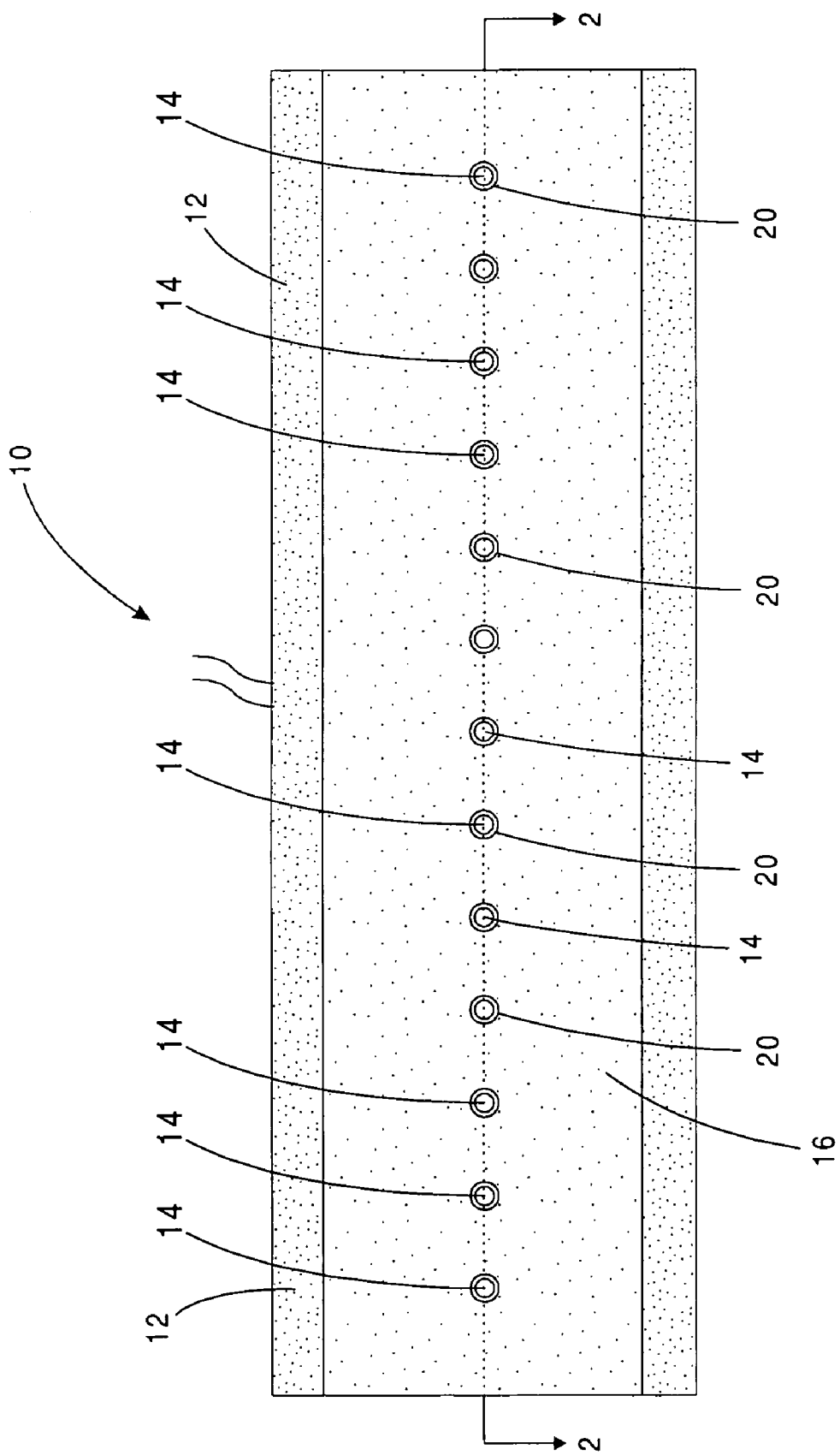
FIG. 1 is a top view of the flame resistant LED construction of the present invention.
Figure 2:
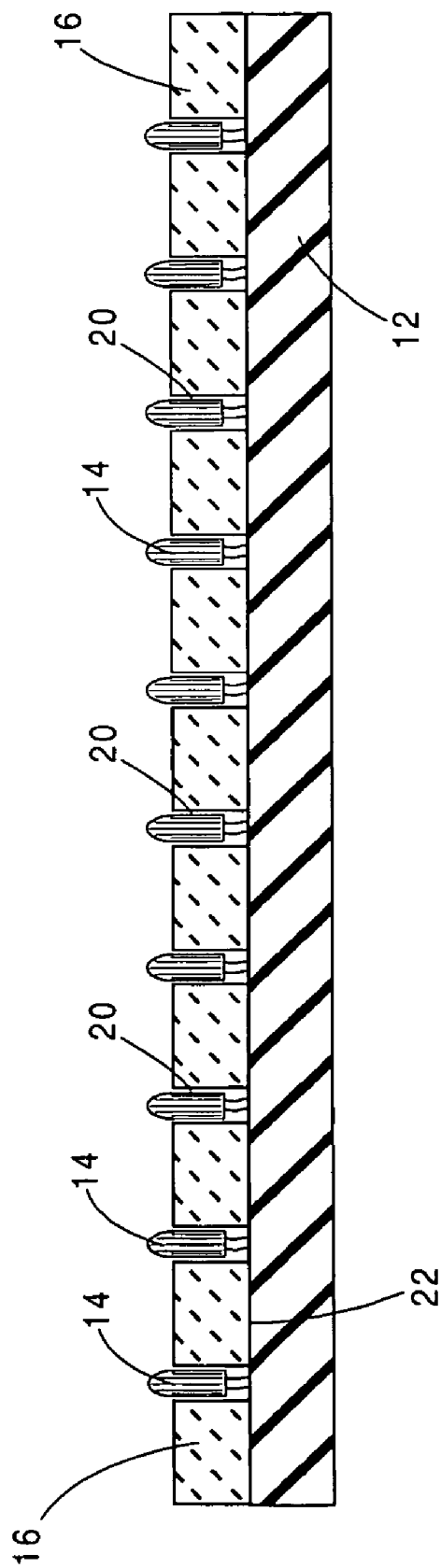
FIG. 2 is a cross-sectional view of the flame resistant LED construction of the present invention.

In one embodiment, the present invention provides a flame resistant LED construction. With reference to FIGS. 1 and 2, a schematic of the flame resistant LED construction of the present invention is provided. FIG. 1 provides a top view and FIG. 2 provides a cross-sectional view. Flame resistant LED construction 10 comprises substrate 12, one or more LEDs 14 that emit light mounted on substrate 12, and intumescent material 16 adjacent to the LEDs 14. The positioning intumescent material 16 is such that at least a portion of the light emitted from LEDs 14 is unobstructed by intumescent material 16. Moreover, a sufficient amount of the intumescent material is in proximity to the LEDs that a flame on the LED is extinguished by the expansion of the intumescent material.

In a first variation of the present embodiment, LEDs 14 are mounted on a circuit board (i.e., substrate 12 is a circuit board.) In such an application, intumescent material 16 is a sheet of intumescent material. Preferably, the sheet of intumescent material defines openings 20 that are adapted to receive LEDs 14. Preferably, the sheet is adhered to substrate 12 along surface 22.

Figure 3:
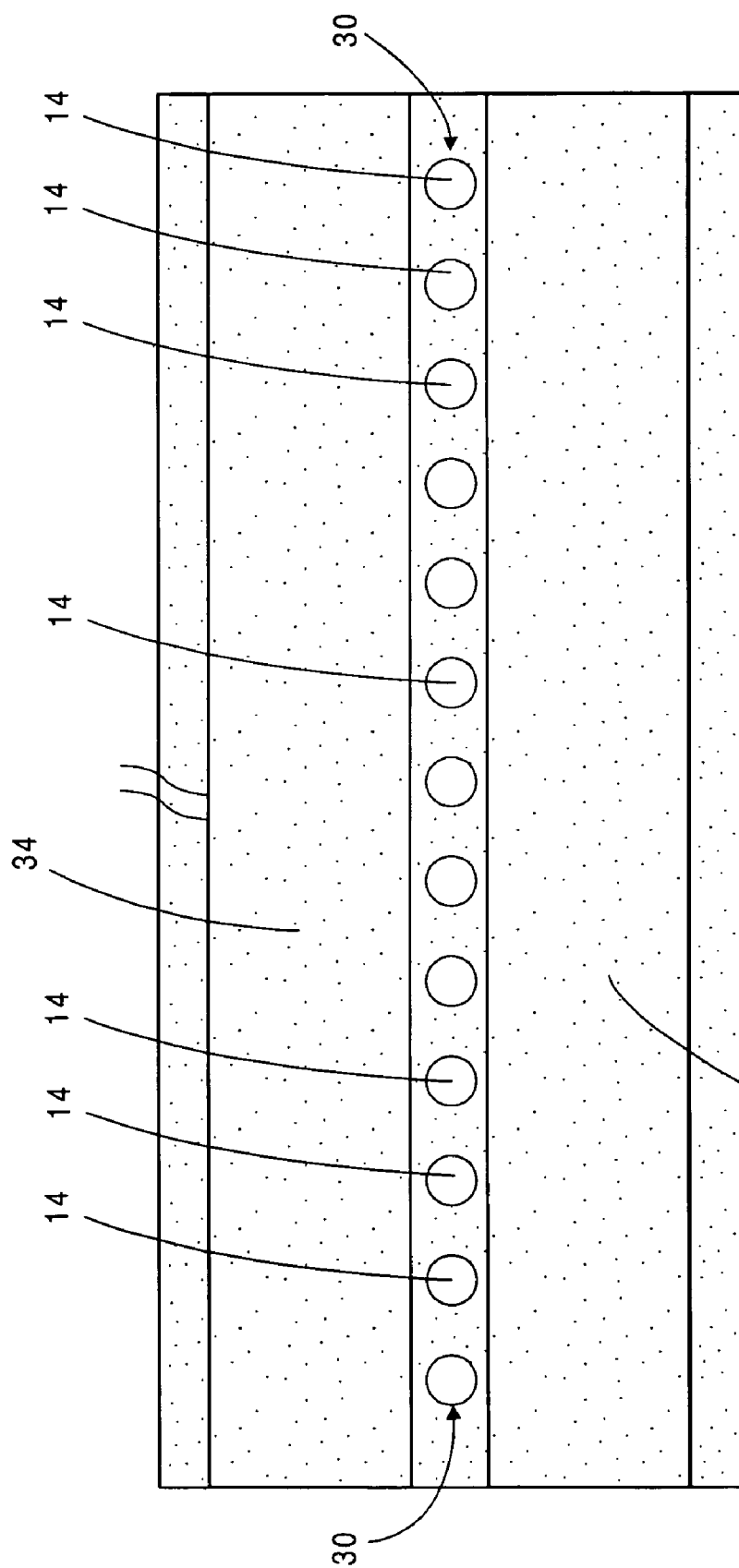
FIG. 3 is a schematic of the flame resistant LED construction of the present invention in which a plurality of LEDs are arranged in tightly packed rows.

With reference to FIG. 3, a second variation of the present invention is provided. In this variation, the LEDs 14 are a plurality of LEDs arranged in row 30. Typically, in this variation, each LED in the row 30 will be so close together that a sheet of intumescent material with holes will be difficult to position over the LEDs. In this variation the intumescent material will preferably comprise sheets 34, 36 of intumescent material such that sheets 34, 36 are positioned on each side of rows 30. Preferably, each of sheets 34, 36 are adhered to substrate 12.

Figure 4:
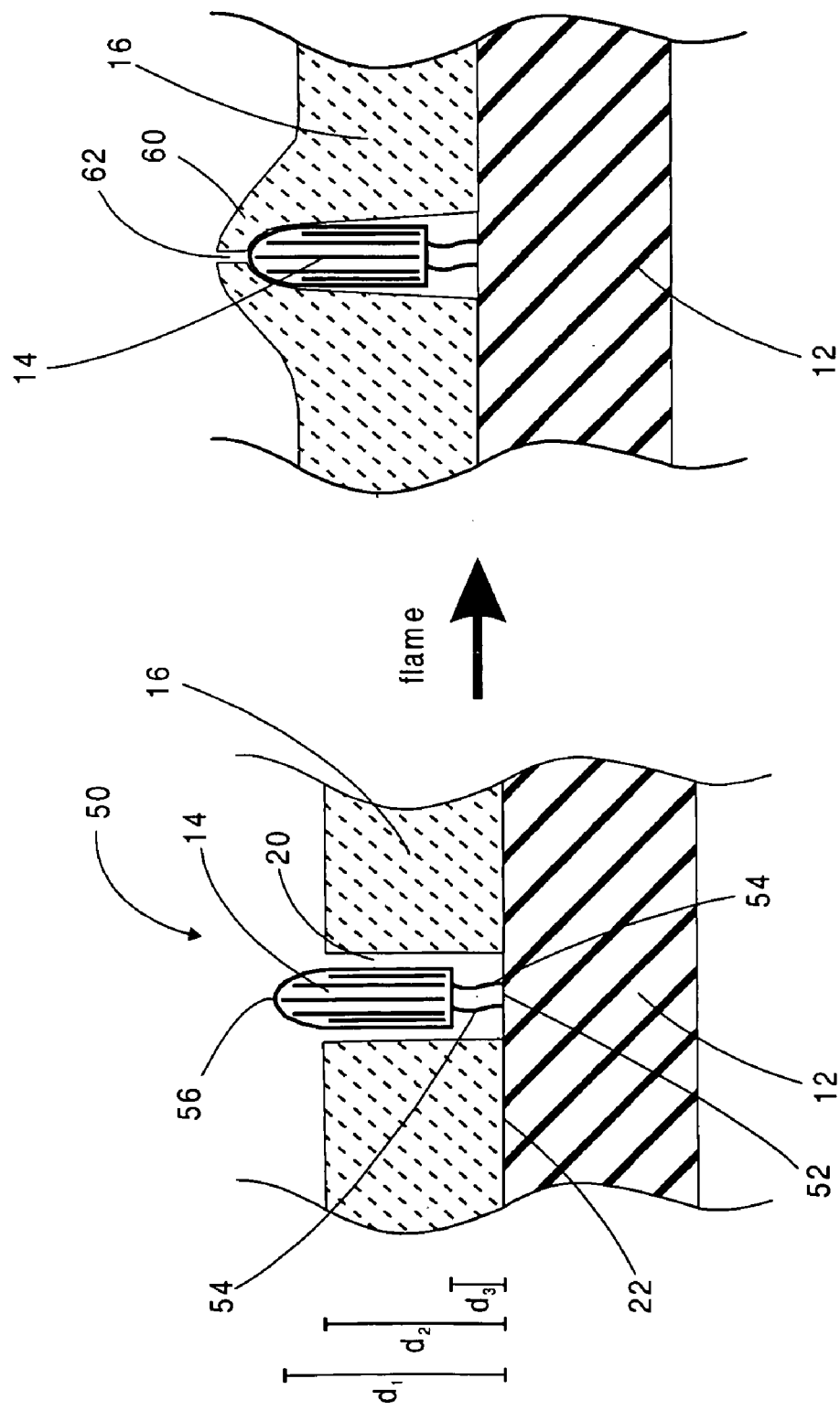
FIG. 4 is a schematic illustrating the operation of the LED construction of the invention is resisting a flame.

With references to FIG. 4, a schematic illustrating the operation of the LED construction of the invention is resisting a flame. LED construction 50 comprises substrate 12, LED 14 that emits light mounted on substrate 12, and intumescent material 16 adjacent to the LEDs 14 as set forth above. LED 14 is attached to substrate 12 at position 52 by leads 54. Top 56 of LED 14 is located at a first distance d1 from substrate 12. Intumescent material 16 is in the form of a sheet having a thickness d2 which is less than distance d1. Distance d3 provides the distance from substrate 12 to the bottom of LED 14 and is typically determined by the length of leads 54. Upon exposure to a sufficiently high temperature or to a flame, intumescent material 16 expands and forms char 60 which at least partially encompasses LED 14. Intumescent material 16 used in the flame resistant LED construction of the invention is further characterized as preferably expanding at a temperature greater than or equal to about 250° F. and forming an insulating char 60 which at least partially encompasses the one or more LEDs. Hole 62 may or may not be formed in char 60. More preferably, intumescent material 16 used in the flame resistant LED construction of the invention expands at a temperature greater than or equal to about 275° F. and forms an insulating char which at least partially encompasses the one or more LEDs, and most preferably, intumescent material 16 expands at a temperature greater than or equal to about 300° F. and forms an insulating char which at least partially encompasses the one or more LEDs. A suitable intumescent material for the flame resistant LED construction of the invention is Firetemp Intumescent Strip commercially available from Johns Manville located in Denver, Colo.

In another embodiment of the invention, a method of making the flame resistant LED construction set forth above is provided. The method of this embodiment comprises adapting one or more sheets of intumescent material to receive a predetermined pattern of one or more LEDs that are mounted on a substrate and then placing the sheets of intumescent material on the substrate onto which the one or more LED's are mounted. A sufficient amount of the intumescent material is in proximity to the LED that when the intumescent material in proximity to the LED attains a temperature greater than or equal to about 250° F. the intumescent material expands and forms an insulating char which at least partially encompasses the one or more LEDs. The details of the intumescent material, the substrate, and the LEDs is the same as set forth above.

In the same manner as set forth for the flame resistant construction, one or more sheets of intumescent material are adapted to receive a predetermined pattern of one or more LEDs by punching holes in a matching pattern in the sheet of intumescent material. This process is known to those skilled in the art of gasket making as a steel rule die process. In a variation of the method, the predetermined pattern of one or more LEDs mounted on the substrate comprise one or more rows of LEDs. In such an application, each LED in the row will be so close together that a sheet of intumescent material with holes will be difficult to position over the LEDs. Accordingly, the two or more sheets of intumescent material are adapted to receive the predetermined pattern by forming strips of the intumescent material to be placed on either side of the one or more rows of LEDs.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A flame resistant LED construction comprising:
   a substrate;
   one or more LEDs that emit light mounted on the substrate; and
   an intumescent material adjacent to the LEDs such that at least a portion of the light emitted from the LED is unobstructed, wherein a sufficient amount of the intumescent material is in proximity to the LED that a flame on the LED is extinguished by the expansion of the intumescent material.

2. The flame resistant LED of claim 1 wherein the substrate is a circuit board.

3. The flame resistant LED of claim 1 wherein the intumescent material comprises one or more sheets of intumescent material.

4. The flame resistant LED of claim 3 wherein the one or more sheets of intumescent material define one or more openings, the one or more openings adapted to receive the one or more LEDs.

5. The flame resistant LED of claim 1 wherein the one or more LEDs are a plurality of LEDs arranged in one or more rows.

6. The flame resistant LED of claim 5 wherein the intumescent material comprises two or more sheets of intumescent material, wherein a sheet of intumescent material is positioned on each side of the one or more rows.

7. The flame resistant LED of claim 1 wherein the intumescent material is adhered to the substrate.

8. The flame resistant LED of claim 1 wherein the intumescent material expands at a temperature greater than or equal to about 250° F. and forms an insulating char which at least partially encompasses the one or more LEDs.

9. The flame resistant LED of claim 1 wherein the intumescent material expands at a temperature greater than or equal to about 275° F. and forms an insulating char which at least partially encompasses the one or more LEDs.

10. The flame resistant LED of claim 1 wherein the intumescent material expands at a temperature greater than or equal to about 300° F. and forms an insulating char which at least partially encompasses the one or more LEDs.

11. The flame resistant LED of claim 1 wherein the LED has a top which is located at a first distance from the substrate and the intumescent material is in the form of a sheet having a thickness which is less than the first distance.

12. A flame resistant LED construction comprising:
    a substrate;
    one or more LEDs that emit light mounted on the substrate;
    an intumescent material adjacent to the LED such that at least a portion of the light emitted from the LED is unobstructed, wherein a sufficient amount of the intumescent material is in proximity to the LED that when the intumescent attains a temperature greater than or equal to about 250° F. the intumescent material expands and forms an insulating char which at least partially encompasses the one or more LEDs.

13. The flame resistant LED of claim 12 wherein a sufficient amount of the intumescent material is in proximity to the LED that when the LED attains a temperature greater than or equal to about 275° F. the intumescent material expands and forms an insulating char which at least partially encompasses the one or more LEDs.

14. The flame resistant LED of claim 12 wherein a sufficient amount of the intumescent material is in proximity to the LED that when the intumescent material attains a temperature greater than or equal to about 300° F. the intumescent material expands and forms an insulating char which at least partially encompasses the one or more LEDs.

15. The flame resistant LED of claim 12 wherein the intumescent material comprises one or more sheets of intumescent material.

16. The flame resistant LED of claim 15 wherein the one or more sheets of intumescent material define one or more openings, the one or more openings adapt to receive the one or more LEDs.

17. The flame resistant LED of claim 12 wherein the one or more LEDs are a plurality of LEDs arranged in one or more rows.

18. The flame resistant LED of claim 17 wherein the intumescent material comprises two or more sheets of intumescent material, wherein a sheet of intumescent material is positioned on each side of the one or more rows.

19. A method of making a flame resistant LED construction comprising:

adapting one or more sheets of intumescent material to receive a predetermined pattern of one or more LEDs that are mounted on a substrate;

placing the one or more sheets of intumescent material on the substrate onto which the one or more LED's are mounted;

wherein a sufficient amount of the intumescent material is in proximity to the LED that when the intumescent material in proximity to the LED attains a temperature greater than or equal to about 250° F. the intumescent material expands and forms an insulating char which at least partially encompasses the one or more LEDs.

20. The method of claim 19 wherein the sheet of intumescent material is adapted to receive a predetermined pattern of one or more LEDs by punching holes in a matching pattern in the sheet of intumescent material.

21. The method of claim 19 wherein the predetermined pattern of one or more LEDs mounted on the substrate comprise one or more rows of LEDs and the one or more sheets of intumescent material is adapted to receive the predetermined pattern by forming strips of the intumescent material to be placed on either side of the one or more rows of LEDs.

* * * * *